(12) United States Patent
Ciavatti et al.

(10) Patent No.: US 9,601,578 B2
(45) Date of Patent: Mar. 21, 2017

(54) NON-PLANAR VERTICAL DUAL SOURCE DRIFT METAL-OXIDE SEMICONDUCTOR (VDSMOS)

(71) Applicant: GLOBALFOUNDRIES Inc., Grand Cayman (KY)

(72) Inventors: Jerome Ciavatti, Hopewell Junction, NY (US); Yanxiang Liu, Glenville, NY (US); Vara Govindeswara Reddy Vakada, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/511,769

(22) Filed: Oct. 10, 2014

(65) Prior Publication Data

US 2016/0104774 A1 Apr. 14, 2016

(51) Int. Cl.

| | |
|---|---|
| *H01L 29/66* | (2006.01) |
| *H01L 27/108* | (2006.01) |
| *H01L 21/70* | (2006.01) |
| *H01L 29/10* | (2006.01) |
| *H01L 29/78* | (2006.01) |
| *H01L 29/08* | (2006.01) |
| *H01L 29/06* | (2006.01) |

(52) U.S. Cl.
CPC ...... *H01L 29/1095* (2013.01); *H01L 29/0653* (2013.01); *H01L 29/0865* (2013.01); *H01L 29/0882* (2013.01); *H01L 29/66712* (2013.01); *H01L 29/7809* (2013.01); *H01L 29/7835* (2013.01); *H01L 29/66545* (2013.01)

(58) Field of Classification Search
CPC ............ H01L 29/1037; H01L 29/0649; H01L 29/0865; H01L 29/0882; H01L 29/1095; H01L 29/66545; H01L 29/7809; H01L 29/0653; H01L 29/66712
USPC ............... 257/329, 299, 330, 510, 623, 140; 438/212, 268
See application file for complete search history.

(56) References Cited

U.S. PATENT DOCUMENTS

| | | | |
|---|---|---|---|
| 2001/0040273 A1* | 11/2001 | Hueting et al. ............... | 257/623 |
| 2002/0185679 A1* | 12/2002 | Baliga ........................... | 257/329 |
| 2003/0168712 A1* | 9/2003 | Shin et al. .................... | 257/510 |
| 2006/0001085 A1* | 1/2006 | Risaki ........................... | 257/330 |
| 2006/0124994 A1* | 6/2006 | Jang et al. .................... | 257/328 |
| 2008/0054325 A1* | 3/2008 | Takahashi et al. ........... | 257/299 |
| 2012/0061756 A1* | 3/2012 | Ibi ................................. | 257/335 |
| 2012/0256252 A1* | 10/2012 | Gui et al. ...................... | 257/329 |

* cited by examiner

*Primary Examiner* — Dzung Tran
(74) *Attorney, Agent, or Firm* — Wayne F. Reinke, Esq.; Heslin Rothenberg Farley & Mesiti P.C.

(57) ABSTRACT

A non-planar lateral drift MOS device eliminates the need for a field plate extension, which reduces gate width. In one example, two sources and two comparatively small gates in a raised structure allow for two channels and a dual current with mirrored flows, each traveling into and downward through a center region of a connecting well that connects the substrate with the drain areas and shallow wells containing the source areas, the current then traveling in opposite directions within the substrate region of the connecting well toward the two drains. The source and drain areas may be separate raised structures or isolated areas of a continuous raised structure.

11 Claims, 7 Drawing Sheets

NON-PLANAR VERTICAL DUAL SOURCE DRIFT METAL-OXIDE SEMICONDUCTOR (VDSMOS)

BACKGROUND OF THE INVENTION

Technical Field

The present invention generally relates to non-planar drift-type semiconductor devices. More particularly, the present invention relates to a non-planar vertical dual source lateral drift metal-oxide non-planar semiconductor structure lacking a field plate extension.

Background Information

Conventional drift MOS (metal-oxide semiconductor) architecture uses a large gate width to accommodate a field plate extension. As semiconductor devices continue to shrink, non-planar devices come into play and space for such a large gate becomes problematic.

Therefore, a need exists to reduce the gate width in a non-planar drift MOS device.

SUMMARY OF THE INVENTION

The shortcomings of the prior art are overcome and additional advantages are provided through the provision, in one aspect, of a method of fabricating a non-planar lateral drift metal-oxide semiconductor. The method includes providing a non-planar semiconductor structure, the structure including a semiconductor substrate and at least one raised semiconductor structure coupled to the substrate, the at least one raised structure including alternating source and drain regions. The method further includes creating a connecting well coupling the substrate with the alternating source and drain regions, creating at least one shallow well, each shallow well encompassing a source region, creating a source in each source region, and creating a drain in each drain region. When active, a current flows around each shallow well and through the connecting well in a single channel from each source to each corresponding drain.

In accordance with another aspect, a non-planar semiconductor device is provided. The device includes a semiconductor substrate, at least one fin coupled to the substrate, the at least one fin including alternating source and drain regions. The device further includes a connecting well coupling the substrate with the alternating source and drain regions, at least one shallow well, each shallow well encompassing a source region, a source in each source region, and a drain in each drain region. When active, a current flows around each shallow well and through the connecting well in a single channel from each source to each corresponding drain.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

Figure 1:
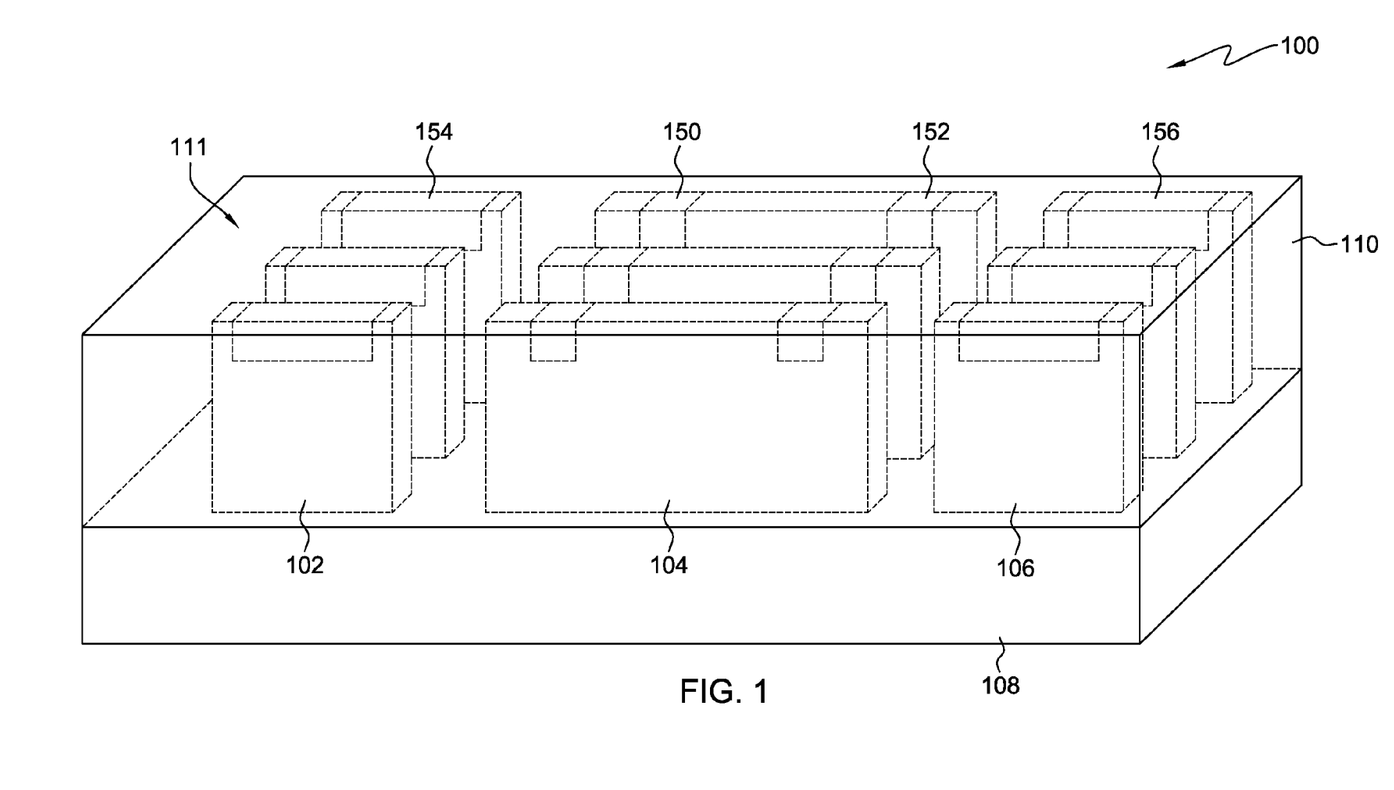
FIG. 1 is a perspective view of one example of a starting non-planar semiconductor structure, the non-planar structure including alternating source and drain regions in three sets of raised structures, each set in this example including left, middle and right raised semiconductor structures coupled to a substrate, isolation material encompassing the raised structures, in accordance with one or more aspects of the present invention.

FIG. 1 is a perspective view of one example of a starting non-planar semiconductor structure 100, including alternating source and drain regions (e.g., source regions 150, 152 and drain regions 154 and 156) in three sets of raised semiconductor structures, e.g., left 102, middle 104 and right 106 raised semiconductor structures (raised with respect to the substrate) coupled to a substrate 108, and including isolation material 110 encompassing the raised structures, in accordance with one or more aspects of the present invention. At this stage of fabrication, the isolation material covers to a top of the raised structures, forming a flat surface 111. In one example, impurities may be inserted into the isolation material through the flat surface, penetrating through the semiconductor material (i.e., the raised structures and partially into the substrate), for example, by implantation. The isolation material may include, for example, shallow-trench isolation material, e.g., an oxide.

The starting structure may be conventionally fabricated, for example, using processes known in the art. However, it will be understood that the fabrication of the starting structure forms no part of the present invention. Further, although only a portion is shown for simplicity, it will be understood that, in practice, many such sets of raised structures would typically be included on the same bulk substrate (e.g., silicon wafer).

In one example, substrate 108 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. In the present example, the substrate is of a first type (i.e., p-type or n-type). The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, raised structures 102, 104 and 106 may each take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type.

Figure 2:
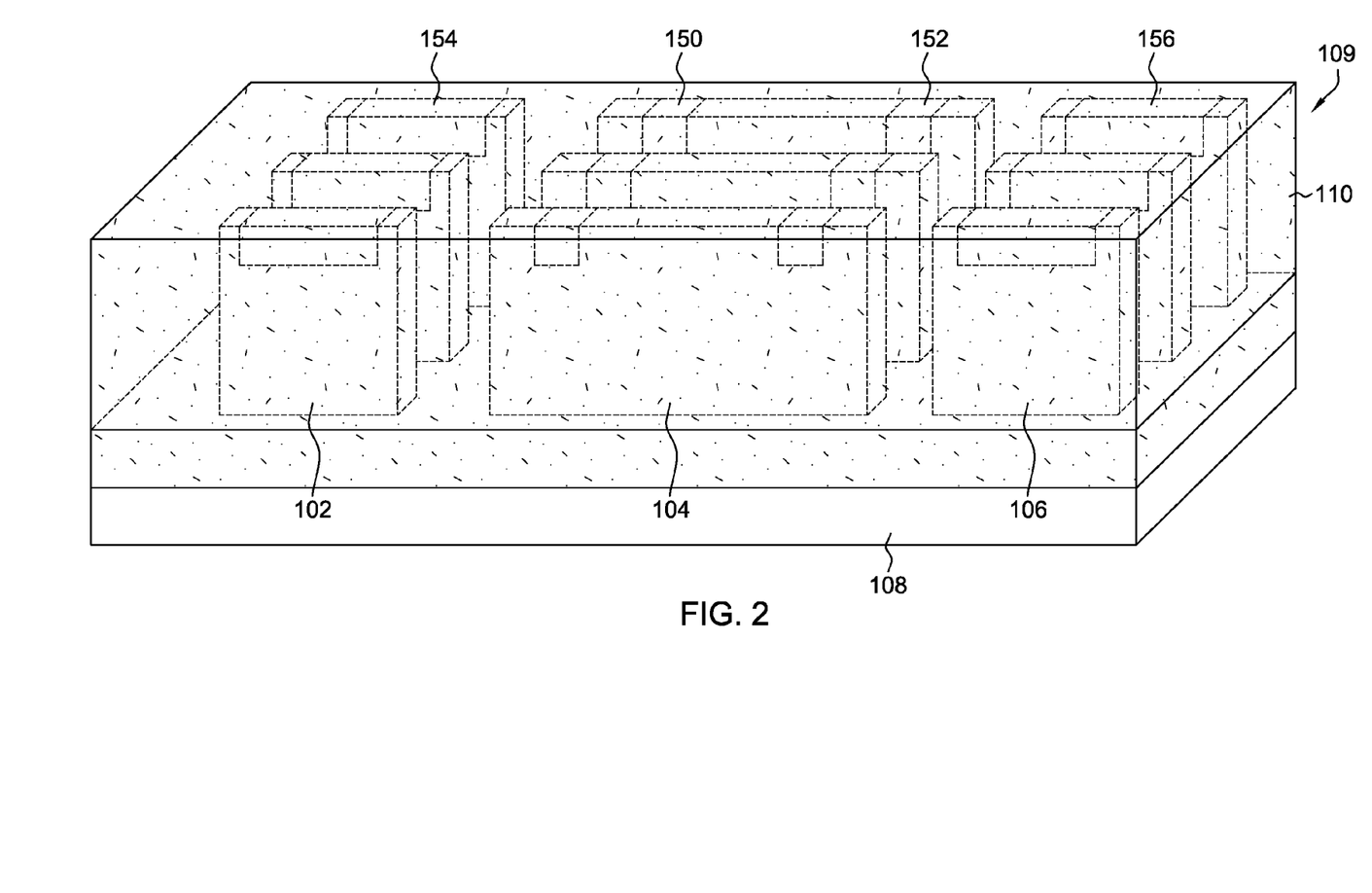
FIG. 2 depicts the semiconductor structure of FIG. 1 after the addition of impurities (e.g., by implantation) into the isolation material, the impurities penetrating the raised structures and into the substrate, allowing for the creation of a connecting well between corresponding raised structures in a given set, the well connecting the corresponding raised structures via the substrate, in accordance with one or more aspects of the present invention.

FIG. 2 depicts the semiconductor structure of FIG. 1 after the addition of impurities 109 of a second type throughout isolation layer 110, penetrating the raised structures and partially into the substrate 108. The impurity/isolation layer will subsequently be recessed, the impurities in the remaining impurity/isolation layer and the substrate creating a connecting well 112 (see FIG. 4) coupling the corresponding raised structures of a set via the substrate, in accordance with one or more aspects of the present invention. In one example, where the substrate is p-type, the connecting well may be n-type. The impurities may be added to the starting structure of FIG. 1 by, for example, implanting the same.

Figure 3:
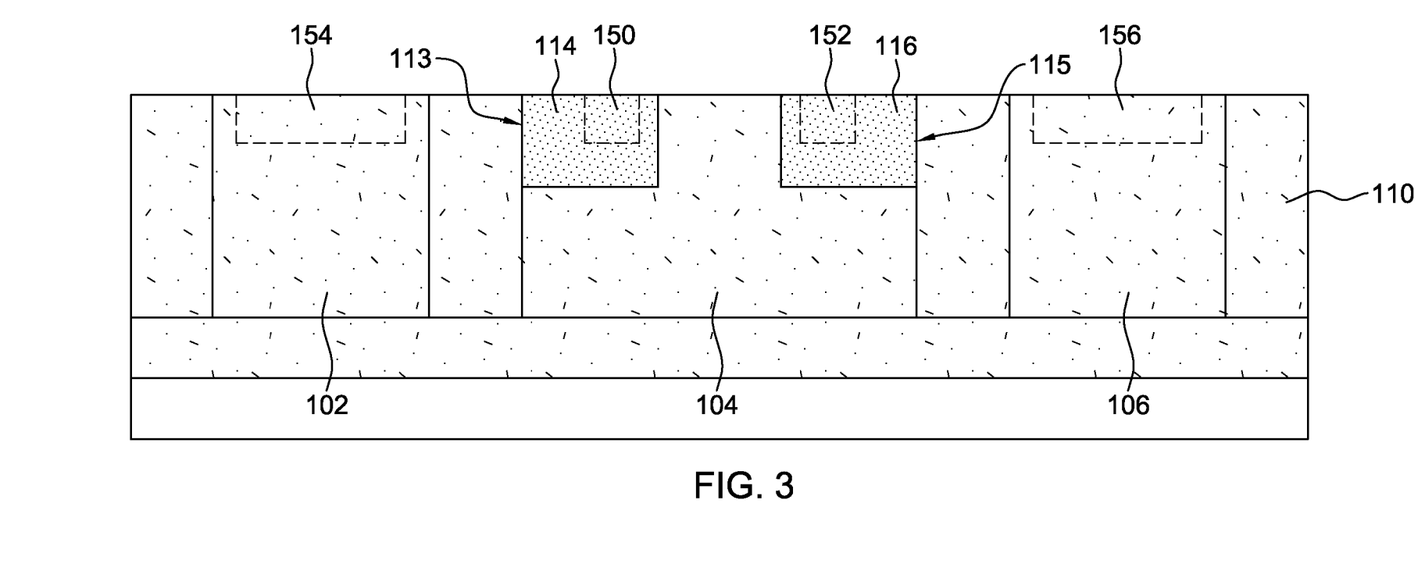
FIG. 3 is a cross-sectional view of the semiconductor structure of FIG. 2 taken across the first set of corresponding raised structures, after the creation of shallow wells at opposite sides of the middle raised structure, in accordance with one or more aspects of the present invention.

FIG. 3 is a cross-sectional view of the semiconductor structure of FIG. 2 taken across corresponding raised structures 102, 104 and 106, after delimiting shallow wells 114 and 116 at opposite sides 113 and 115 of the middle raised structure 104, in accordance with one or more aspects of the present invention. The shallow wells encompass the source regions 150 and 152, and extend downward about 10 nm to about 80 nm into the middle raised structure. In one example, where the substrate is p-type and the connecting well is n-type, the shallow wells may be p-type. The shallow wells may be created by, for example, implantation.

Figure 4:
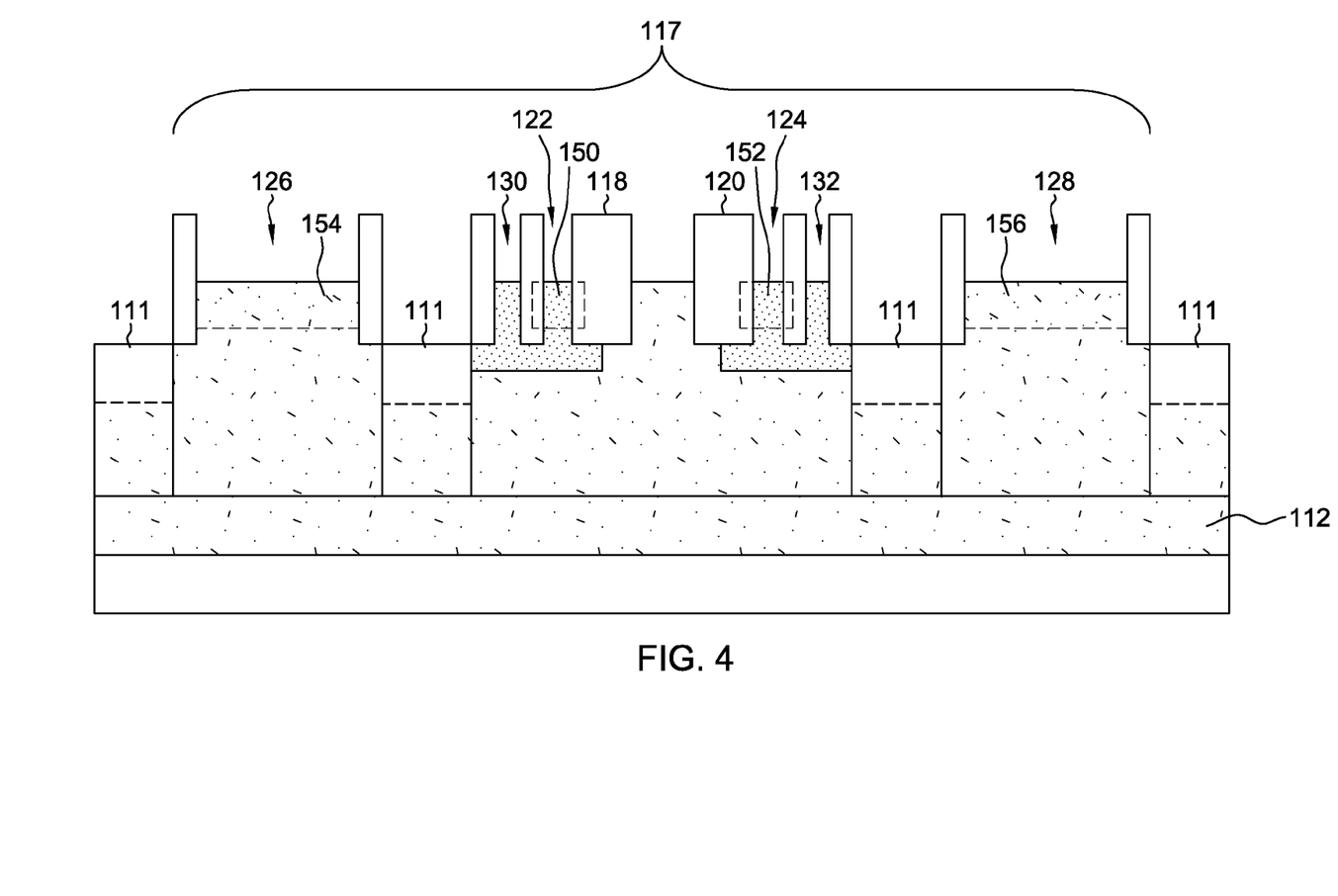
FIG. 4 depicts the semiconductor structure of FIG. 3 after recessing the isolation material with impurities, and creation of dummy gates, the dummy gates surrounding portions of the relevant raised structures, in accordance with one or more aspects of the present invention.

FIG. 4 depicts the semiconductor structure of FIG. 3 after recessing the isolation/impurity layer about 20 nm to about 50 nm, leaving an isolation region 111 over the connecting well, and after creation of dummy gates 117 surrounding the raised structures down to a top of the isolation region, in accordance with one or more aspects of the present invention. The dummy gates act as placeholders for eventual replacement metal gates, and may include, for example, polysilicon, and may be created using, for example, conventional processes and techniques. Preferably, the dummy gates are all created in a same process. Center gates 118 and 120 will be the active gates when subsequently replaced by metal gates. The remainder of the gates delineate areas 122 and 124 for creation of two sources (see source regions of FIG. 3, omitted for clarity of the dummy gates), areas 126 and 128 for creation of two drains (see drain regions of FIG. 3), and areas 130 and 132 for creation of two shallow well taps.

Figure 5:
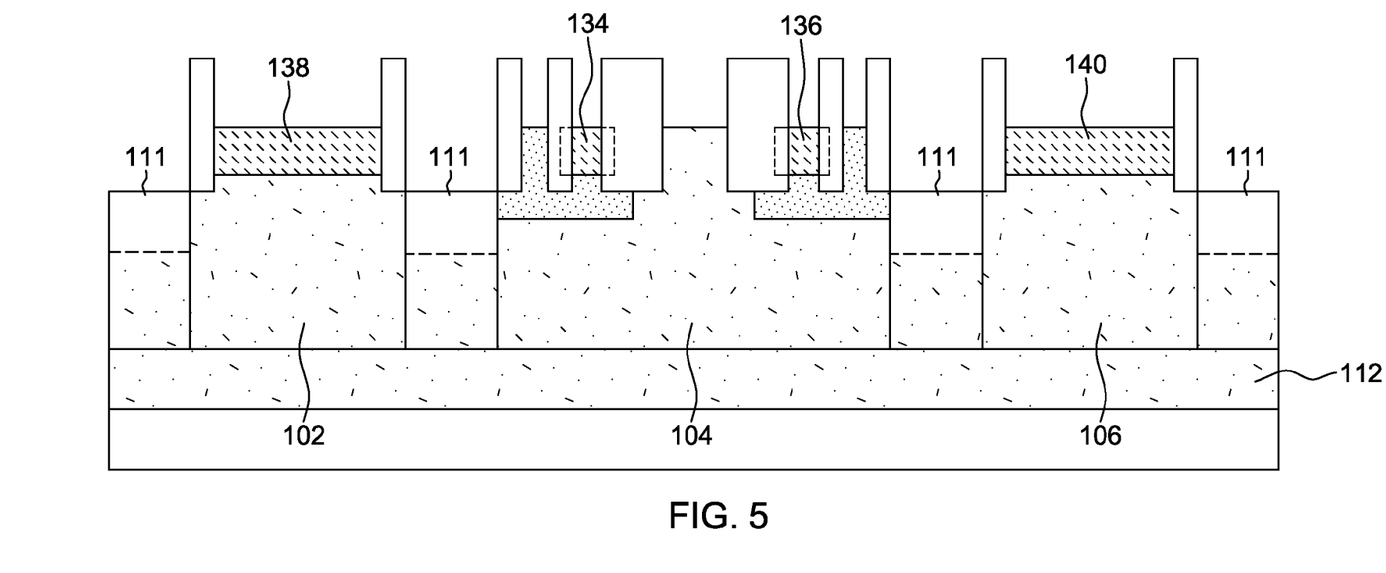
FIG. 5 depicts the semiconductor structure of FIG. 4 after creation of source implant regions in source regions of the shallow wells, the implant regions acting as sources, and drain implant regions in drain regions of the left and right raised structures, the drain implant regions acting as drains for the adjacent sources, in accordance with one or more aspects of the present invention.

FIG. 5 depicts the semiconductor structure of FIG. 4 after creation of impurity regions 134 and 136 in the shallow wells of the middle raised structure 104 to act as sources (i.e., impurities in the source regions), and creation of impurity regions 138 and 140 in the left 102 and right 106 raised structures, respectively, adjacent the sources to act as drains (i.e., impurities in the drain regions), in accordance with one or more aspects of the present invention. In one example, the sources and drains may take the form of epitaxy. The epitaxy may be created by, for example, first etching the relevant portions of the raised structures to create cavities of about 20 nm to about 60 nm in depth for the epitaxy. The etching may be accomplished using, for example, conventional processes and techniques. Where the raised structures are, for example, silicon based, the n-type epitaxy may include epitaxial silicon doped with phosphorus (eSiP), and the p-type epitaxy may include epitaxial silicon germanium (eSiGe). The epitaxy may be grown, for example, using conventional processes and techniques.

In another example, the sources and drains take the form of impurities (e.g., by implanting), and are preferably relatively dense with impurities compared to the shallow wells.

For either process of forming the sources and drains, in one example, where the substrate is p-type, the connecting well is n-type and the shallow wells are p-type, the sources and drains may be n-type. In another example, where the substrate is n-type, the connecting well is p-type and the shallow wells are n-type, the sources and drains may be p-type. The sources and drains are preferably created in a same process.

Figure 6:
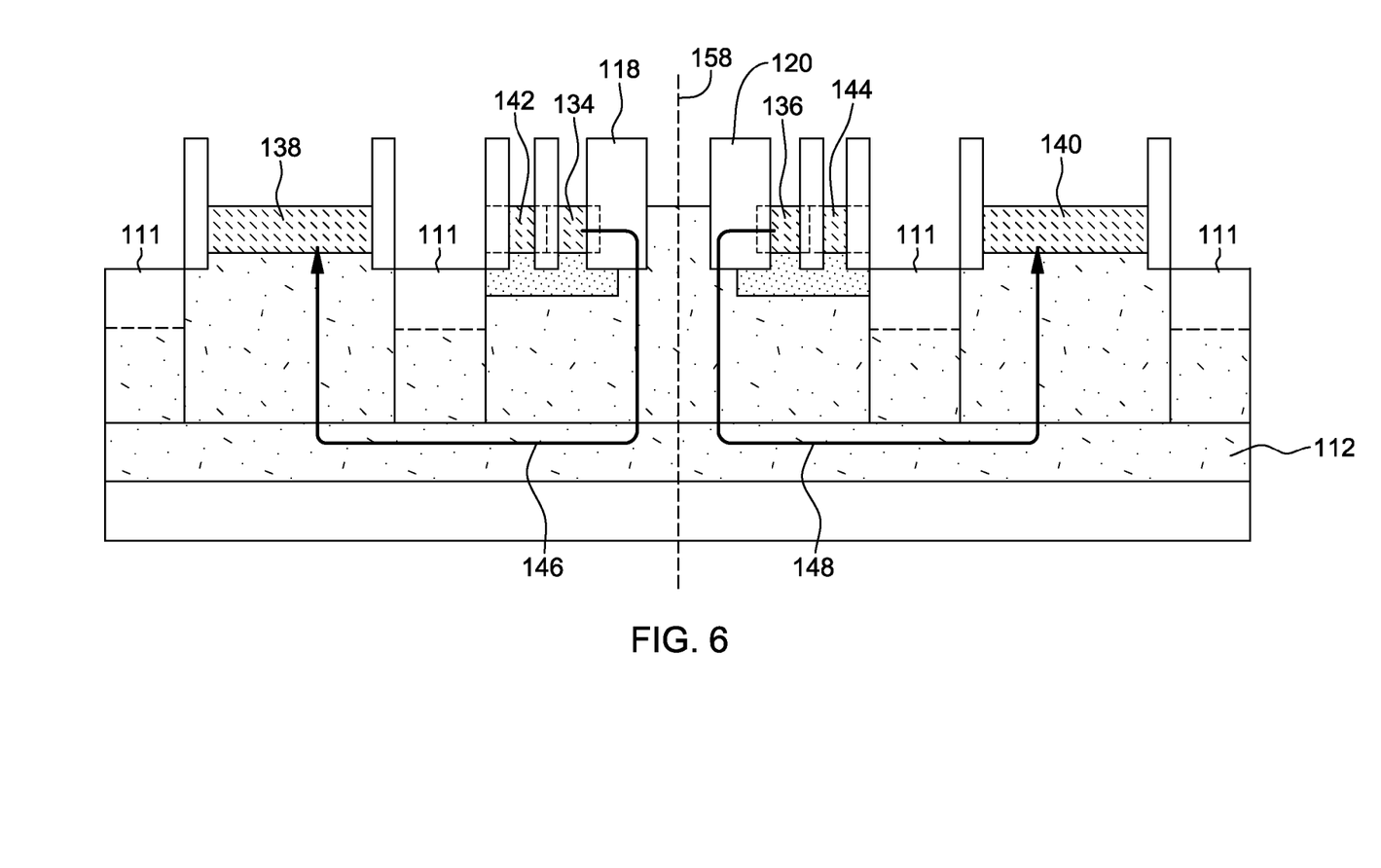
FIG. 6 depicts the semiconductor structure of FIG. 5 after creation of shallow well taps, and showing current paths in operation, in accordance with one or more aspects of the present invention.

FIG. 6 depicts the semiconductor structure of FIG. 5 after creation of shallow well taps 142 and 144, and showing current paths 146 and 148 in operation (after downstream creation of replacement metal gates), in accordance with one or more aspects of the present invention. As one skilled in the art will know, the well taps serve the purpose of body contact to ensure a good control of the channel. In one example, similar to the example for the sources and drains described above, the well taps may take the form of epitaxy of the first type. The epitaxy may be created by, for example, first etching the relevant portions of the raised structures to create cavities of about 20 nm to about 60 nm in depth for the epitaxy. The etching may be accomplished using, for example, conventional processes and techniques. Where the raised structures are, for example, silicon based, the n-type epitaxy may include epitaxial silicon doped with germanium (eSiGe), and the p-type epitaxy may include epitaxial silicon germanium (eSiGe). The epitaxy may be grown, for example, using conventional processes and techniques.

In another example, the well taps may take the form of impurities created, for example, by implantation. Preferably, the well taps are relatively dense with impurities compared to the shallow wells. In one example, where the substrate is p-type, the connecting well is n-type and the shallow wells are p-type, the well taps may be p-type. The well taps are a same type as the shallow wells.

Also shown in FIG. 6, are current paths 146 and 148 in operation, which assumes the presence of replacement metal gates, which may be, for example, conventional replacement gates including, e.g., tungsten. The current paths travel from each source 134 and 136 toward the center of middle raised structure 104, vertically downward into the substrate region of connecting well 112, and then in opposite directions toward their respective drains 138 and 140. In one example, the finished structure may take the form of a non-planar dual source lateral drift metal-oxide semiconductor device.

Figure 7:
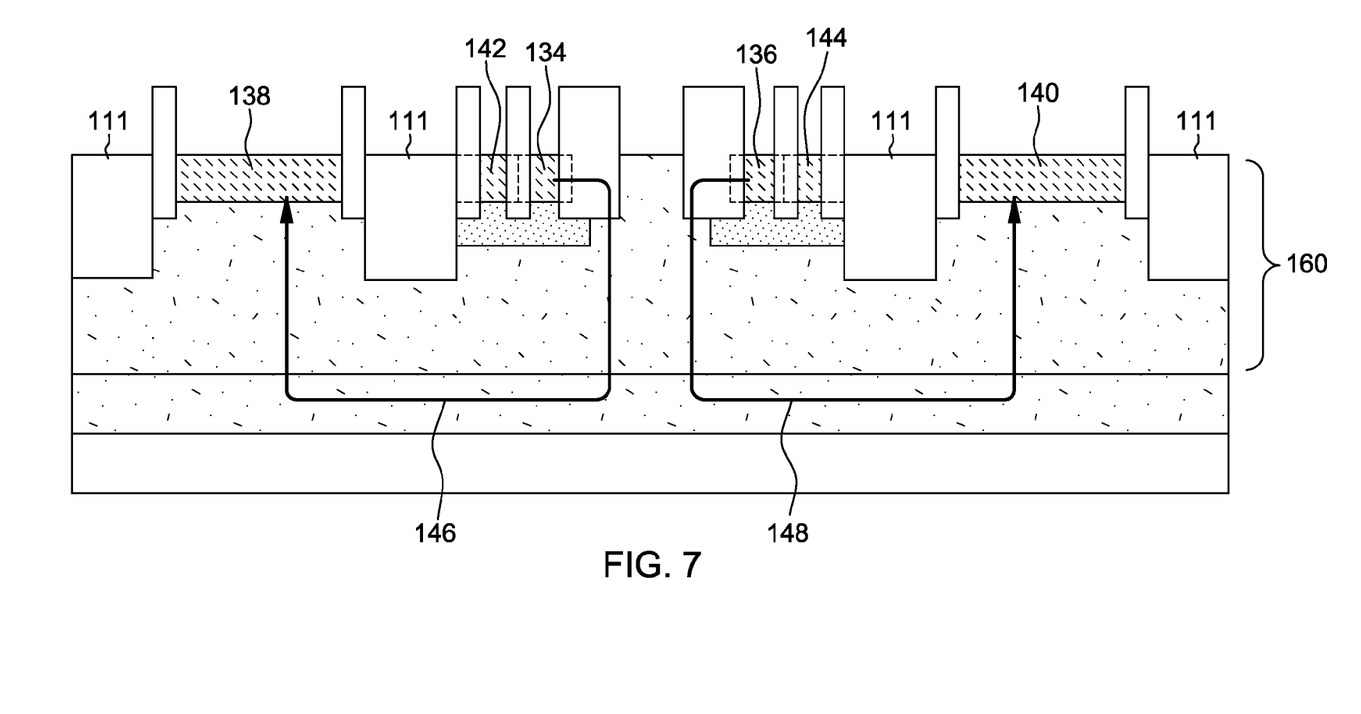
FIG. 7 depicts an alternative form of the finished structure of FIG. 6, replacing each set of raised structures with a single raised structure, the various regions/wells being separated by isolation regions.

FIG. 7 depicts one example of an alternate version of the semiconductor structure of FIG. 6, including a semiconductor substrate, and replacing each set of raised structures with a single, continuous semiconductor raised structure, the continuous raised structure including the shallow wells, sources, drains and gates as in FIG. 6, except that the various regions are all situated within the continuous raised structure and separated by isolation regions, rather than separation via multiple raised structures.

In a first aspect, disclosed above is a method of fabricating a non-planar lateral drift metal-oxide semiconductor. The method includes providing a non-planar semiconductor structure, the structure including a semiconductor substrate and raised semiconductor structure(s) coupled to the substrate, the raised structure(s) including alternating source and drain regions. The method further includes creating a connecting well coupling the substrate with the alternating source and drain regions, creating shallow well(s) encompassing the source region(s), creating a source in each of the source region(s), and creating a drain in each drain region. When active, a current flows around each shallow well and through the connecting well in a single channel from each source to each corresponding drain.

In one example, the raised structure(s) may further include, for example, multiple raised structures, each raised structure including one or more of the alternating source and drain regions, and the non-planar semiconductor structure may further include, for example, insulation material separating the multiple raised structures.

In one example, the multiple raised structures may include, for example, source raised structure(s) and drain raised structure(s), each source raised structure including shallow well(s) and each drain raised structure including one drain. Further, the drain raised structure(s) may include, for example, multiple drain raised structures, each drain raised structure including a drain region, the source raised structure(s) being situated between drain raised structures, the shallow well(s) including multiple shallow wells situated at opposite sides of the source raised structure(s), and the connecting well separating the shallow well(s) and coupling the substrate with the source regions in the shallow well(s) and the drain regions in the drain raised structures.

In one example, each of the raised structure(s) of the method of the first aspect may include, for example, the source region(s) and the drain region(s) isolated from each other.

In one example, the method of the first aspect may further include, for example, creating a separate gate lacking a field gate extension adjacent each shallow well. Further, each gate may include, for example, a dummy gate, or a conductive gate. Where a conductive gate is present, when active, each gate controls a single channel.

In one example, the method of the first aspect may further include, for example, creating a well tap in each shallow well at an edge of the raised structure in which the shallow well is located.

In a second aspect, disclosed above is a non-planar semiconductor device. The device includes a semiconductor substrate, raised structure(s) coupled to the substrate, the raised structure(s) including alternating source and drain regions. The device further includes a connecting well coupling the substrate with the alternating source and drain regions, shallow well(s) encompassing the source region(s), a source in each of the source region(s), and a drain in each drain region. When active, a current flows around each shallow well and through the connecting well in a single channel from each source to each corresponding drain.

In one example, the semiconductor device of the second aspect may further include, for example, a separate gate lacking a field gate extension adjacent each shallow well.

Further, each gate may include, for example, a dummy gate, or a conductive gate. Where a conductive gate is present, when active, each gate controls a single channel.

In one example, the semiconductor device of the second aspect may further include, for example, a well tap in each shallow well at an edge of the raised structure in which the shallow well is located.

In one example, the semiconductor substrate of the device of the second aspect may further include, for example, a bulk semiconductor substrate, the non-planar semiconductor device including multiple of the non-planar semiconductor devices on the bulk substrate.

In one example, the semiconductor device of the second aspect, when active, may have, for example, a current flowing from each source through the connecting well and to the drain.

In one example, the raised structure(s) may include, for example, multiple raised structures, each raised structure including one or more of the alternating source and drain regions, and the non-planar semiconductor structure may further include, for example, insulation material separating the multiple raised structures.

In one example, the multiple raised structures may include, for example, source raised structure(s) and drain raised structure(s), each source raised structure including shallow well(s) and each drain raised structure including one drain. Further, the drain raised structures may include, for example, multiple drain raised structures, each drain raised structure including a drain region, the source raised structure(s) being situated between drain raised structures, the shallow well(s) including multiple shallow wells situated at opposite sides of the source raised structure(s), and the connecting well separating the shallow well(s) and coupling the substrate with the source regions in the shallow well(s) and the drain regions in the drain raised structures.

In one example, each of the raised structure(s) of the semiconductor device of the second aspect may include, for example, the source region(s) and the drain region(s) isolated from each other.

While several aspects of the present invention have been described and depicted herein, alternative aspects may be effected by those skilled in the art to accomplish the same objectives. For example, the finished structure may take the form of a n-type VDSMOS. The connecting well for the n-type VDSMOS would be p-type and would be isolated from a p-type substrate by a conventional triple n-type well. Conventional processes and techniques could be used to fabricate an isolated p-well on a p-type substrate. As another example, the finished structure may simply be one half of the dual-source version of FIG. 6, either half, delimited by line 158. Accordingly, it is intended by the appended claims to cover all such alternative aspects as fall within the true spirit and scope of the invention.

The invention claimed is:

1. A non-planar semiconductor device, comprising:
   a semiconductor substrate;
   at least one fin coupled to the substrate, the at least one fin comprising alternating source and drain regions;
   a connecting well coupling the substrate with the alternating source and drain regions;
   at least one shallow well, each shallow well encompassing a source region;
   a source in each source region; and
   a drain in each drain region, wherein when active a current flows around each shallow well and through the connecting well in a single channel from each source to each corresponding drain.

2. The semiconductor device of claim 1, further comprising a separate gate lacking a field gate extension adjacent each shallow well.

3. The semiconductor device of claim 2, wherein each gate comprises a dummy gate.

4. The semiconductor device of claim 2, wherein each gate comprises a conductive gate, and wherein when active each gate controls a single channel.

5. The semiconductor device of claim 1, further comprising a well tap in each shallow well at an edge of the fin in which the shallow well is located.

6. The semiconductor device claim 1, wherein the semiconductor substrate comprises a bulk semiconductor substrate, and wherein the non-planar semiconductor device comprises a plurality of the non-planar semiconductor devices on the bulk substrate.

7. The semiconductor device of claim 1, wherein when active, a current flows from each source through the connecting well and to the drain.

8. The semiconductor device of claim 1, wherein the at least one fin comprises a plurality of fins, each fin comprising one or more of the alternating source and drain regions, and wherein the provided non-planar semiconductor structure further comprises insulation material separating the plurality of fins.

9. The semiconductor device of claim 8, wherein the plurality of fins comprises at least one source fin and at least one drain fin, each source fin comprising at least one shallow well and each drain fin comprising one drain.

10. The semiconductor device of claim 9, wherein the at least one drain fin comprises at least two drain fins, each drain fin comprising a drain region, wherein the at least one source fin is situated between the at least two drain fins, wherein the at least one shallow well comprises at least two shallow wells situated at opposite sides of the at least one source fin, and wherein the connecting well separates the at least two shallow wells and connects the substrate with the source regions in the at least two shallow wells and the drain regions in the at least two fins.

11. The semiconductor device of claim 1, wherein each of the at least one fin comprises the at least one source region and the at least one drain region isolated from each other.

* * * * *